(12) United States Patent
Ono et al.

(10) Patent No.: US 8,758,505 B2
(45) Date of Patent: Jun. 24, 2014

(54) SILICON WAFER AND METHOD FOR MANUFACTURING THE SAME

(75) Inventors: Toshiaki Ono, Tokyo (JP); Wataru Sugimura, Tokyo (JP); Masataka Hourai, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 1087 days.

(21) Appl. No.: 12/728,970

(22) Filed: Mar. 22, 2010

(65) Prior Publication Data

US 2010/0178753 A1 Jul. 15, 2010

Related U.S. Application Data

(62) Division of application No. 11/184,869, filed on Jul. 20, 2005, now Pat. No. 7,824,493.

(30) Foreign Application Priority Data

Jul. 22, 2004 (JP) ................................ 2004-214983

(51) Int. Cl.
*C30B 1/02* (2006.01)
(52) U.S. Cl.
USPC ......... 117/2; 117/3; 117/17; 117/20; 117/932
(58) Field of Classification Search
USPC ................................. 117/2, 3, 13, 17, 20, 932
See application file for complete search history.

(56) References Cited

U.S. PATENT DOCUMENTS

| | | | |
|---|---|---|---|
| 4,661,166 A | 4/1987 | Hirao |
| 5,698,891 A | 12/1997 | Tomita et al. |
| 6,107,209 A | 8/2000 | Ohkuma |
| 6,245,430 B1 | 6/2001 | Hourai et al. |
| 6,365,461 B1 | 4/2002 | Asayama et al. |
| 6,414,373 B2 | 7/2002 | Yamada et al. |
| 6,569,237 B2 | 5/2003 | Tanaka et al. |
| 6,579,779 B1 | 6/2003 | Falster |
| 6,586,068 B1 | 7/2003 | Falster et al. |
| 6,599,816 B2 | 7/2003 | Sueoka et al. |
| 6,613,678 B1 | 9/2003 | Sakaguchi et al. |
| 6,709,957 B2 | 3/2004 | Asayama et al. |
| 6,835,245 B2 | 12/2004 | Ono et al. |

(Continued)

FOREIGN PATENT DOCUMENTS

| | | |
|---|---|---|
| JP | 60-3130 | 1/1985 |
| JP | 04-171827 | 6/1992 |
| JP | 09-69526 | 3/1997 |
| JP | 2002-134521 | 10/2002 |

OTHER PUBLICATIONS

Japanese Office Action dated May 6, 2010 for Appln. No. 2004-214983.

(Continued)

*Primary Examiner* — Bob M Kunemund
(74) *Attorney, Agent, or Firm* — Pillsbury Winthrop Shaw Pittman, LLP

(57) ABSTRACT

A method for manufacturing a silicon wafer includes a step of annealing a silicon wafer which is sliced from a silicon single crystal ingot, thereby forming a DZ layer in a first surface and in a second surface of the silicon wafer and a step of removing either a portion of the DZ layer in the first surface or a portion of the DZ layer in the second surface.

5 Claims, 6 Drawing Sheets

(56) References Cited

U.S. PATENT DOCUMENTS

| | | |
|---|---|---|
| 6,905,771 B2 | 6/2005 | Ono et al. |
| 7,014,704 B2 | 3/2006 | Ono et al. |
| RE39,173 E | 7/2006 | Hourai et al. |
| 7,397,110 B2 | 7/2008 | Takase et al. |
| 2001/0055859 A1 | 12/2001 | Yamada et al. |
| 2002/0026893 A1* | 3/2002 | Falster et al. ............... 117/20 |
| 2002/0170631 A1 | 11/2002 | Falster et al. |
| 2003/0192469 A1 | 10/2003 | Libbert et al. |
| 2004/0053516 A1 | 3/2004 | Nakada et al. |
| 2004/0207048 A1 | 10/2004 | Shiota et al. |
| 2005/0005841 A1 | 1/2005 | Falster et al. |
| 2005/0054124 A1* | 3/2005 | Mun et al. ............... 438/12 |
| 2005/0247259 A1 | 11/2005 | Yoon et al. |
| 2005/0253221 A1 | 11/2005 | Takase et al. |
| 2006/0075960 A1 | 4/2006 | Borgini et al. |
| 2007/0017436 A1 | 1/2007 | Ono et al. |

OTHER PUBLICATIONS

Japanese Office Action dated Apr. 26, 2010 for Appln. No. 2004-214983.

* cited by examiner

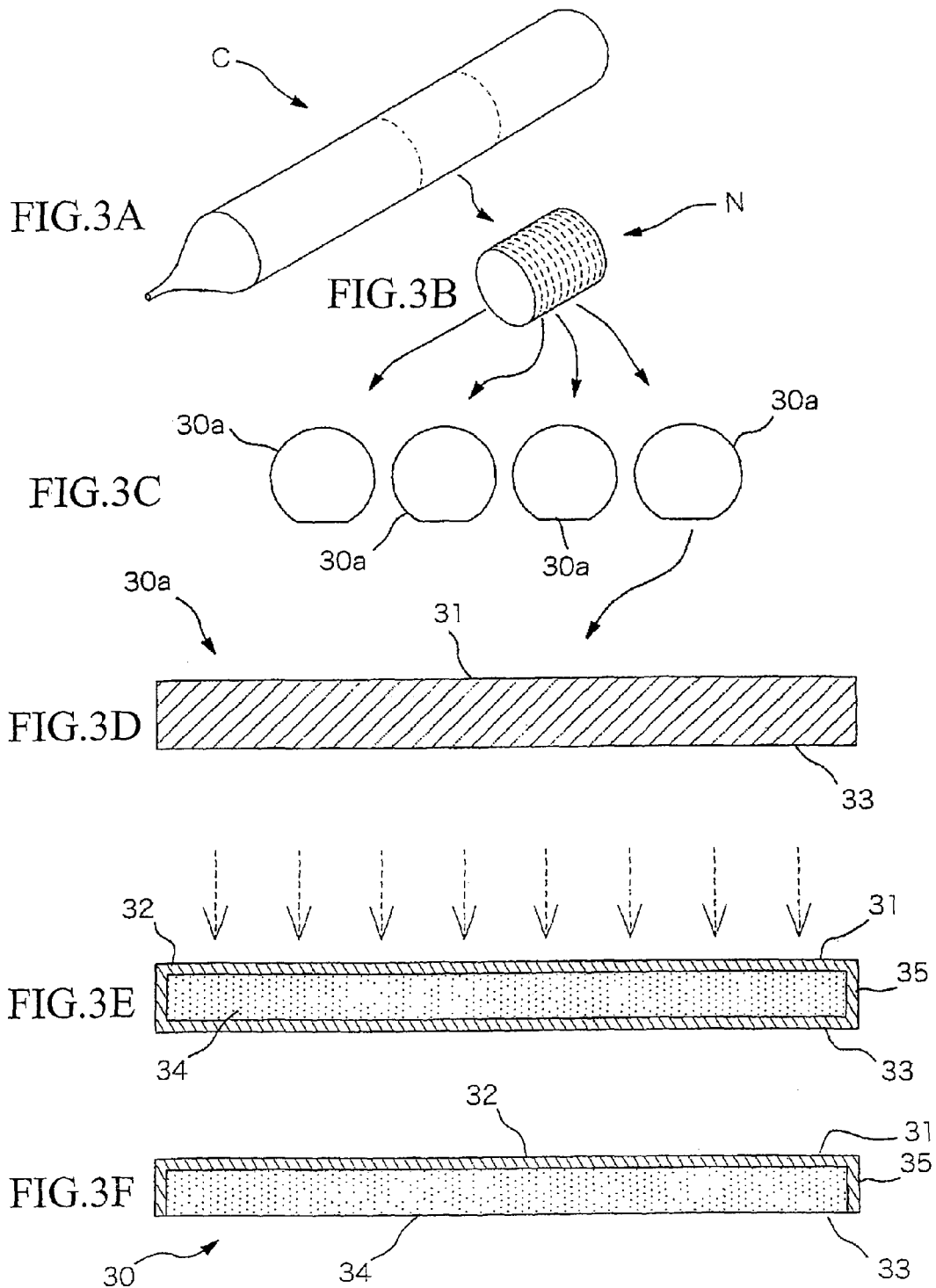

SILICON WAFER AND METHOD FOR MANUFACTURING THE SAME

The present application is a divisional of U.S. patent application Ser. No. 11/184,869 filed Jul. 20, 2005 now U.S. Pat. No. 7,824,493, which claims priority to Japanese Application No. P2004-214983 filed Jul. 22, 2004, of which the entire contents of both are incorporated herein by reference.

BACKGROUND OF THE INVENTION

1. Field of the Invention

The present invention relates to a method for manufacturing a silicon wafer obtained by slicing a silicon single-crystal ingot produced by the Czochralski method, and to a technology appropriate for suppressing slip dislocations to improve wafer mechanical strength.

The present invention contains subject matter related to Japanese Patent Application No. 2004-214983, filed on Jul. 22, 2004, the contents of which are incorporated herein by reference.

2. Description of the Related Art

Single-crystal silicon wafers used as substrates for semiconductor devices and the like are manufactured by slicing a silicon single-crystal ingot and performing heat treatment, mirror polishing, and other processing. Methods for manufacturing such silicon single-crystal ingots include for example the Czochralski method (CZ method). Because the CZ method can be used to manufacture single-crystal ingots having large diameters and because defect control is comparatively easy, this method is the main method employed in the method for manufacturing the silicon single-crystal ingots.

In order to form semiconductor devices on single-crystal silicon wafers, it is required that there is no crystal defects in a device formation area. In the case in which the crystal defects exist in the surface in which circuitry is formed, the defect portion may be the cause of circuit breakdown or other problems. A silicon single crystal pulled using the CZ method includes a supersaturated concentration of oxygen atoms at interstitial lattice sites. This supersaturated oxygen causes an occurrence of micro defects which are called BMDs (bulk micro defects) during annealing treatment in subsequent bulk processes.

On the other hand, because such BMDs act as getters for metal impurities and other causes of crystal defects, a DZ-IG method is known in which an IG (intrinsic gettering) layer acting as an impurity getter is formed by annealing a silicon wafer to cause BMDs within the wafer, and a DZ (denuded zone) layer with no lower limit to the crystal defect is formed at the silicon wafer surface.

However, in subsequent manufacturing or device fabrication entailing processes, there is a problem that when annealing a silicon wafer in which such a DZ (denuded zone) layer is formed, dislocation defects (slip) tend to occur within the wafer. Particularly when annealing is performed in a state in which the wafer is supported by a heat treatment boat or similar, slip dislocations tend to propagate from the portions being supported on the rear surface of the wafer, resulting in a damage to the wafer during manufacturing processes, and possibly culminating in a destruction of the wafer. Consequently, as disclosed in Patent Reference 1, a method is proposed in which damage (contact damage) to the rear surface of the wafer arising from contact of the silicon wafer with the heat treatment boat during a heat treatment to form a DZ layer is removed by etching or by mechanical polishing, to suppress the occurrence of dislocation defects (slip).

However, because the silicon wafer in which the DZ layer is formed is in a state in which a oxygen concentration in the DZ zone is extremely low due to outward diffusion of oxygen, the wafer strength is inherently low, and in the case in which minute abrasions, dislocations, or the like occur during annealing processes in the course of device fabrication or the like, slip dislocations easily propagate. Therefore, there is a problem that the occurrence of dislocation defects (slip) cannot be adequately suppressed merely by removal of the damage layer on the rear surface of the wafer.

Patent Reference 1: Japanese published unexamined patent application No. 2002-134521

SUMMARY OF THE INVENTION

In light of the above circumstances, an object of the present invention is to provide a silicon wafer with excellent strength characteristics and provided with a DZ layer having extremely few crystal defects, and a method for manufacturing the same.

In order to attain the above object a method for manufacturing a silicon wafer of a first aspect of the present invention includes a step of annealing a silicon wafer which is sliced from a silicon single crystal ingot, thereby forming a DZ layer in a first surface and in a second surface of the silicon wafer, and a step of removing either a portion of the DZ layer in the first surface or a portion of the DZ layer in the second surface.

The method further may include a step of removing a portion of the DZ layer formed in a circumference of the silicon wafer. It is preferable that in the step of annealing the silicon wafer, the annealing is performed in a non-oxidizing atmosphere at a temperature of 1000° C. or higher. It is preferable that in the step of removing the portion of the DZ layer, in a surface portion from which the DZ layer is removed in the first surface or in the second surface, a concentration of oxygen is made to be $10 \times 10^{17}$ atoms/cm$^3$ or higher.

The step of removing the portion of the DZ layer may be a step of reducing a thickness of the DZ layer by mirror polishing. A silicon wafer which is manufactured by the above-described method for manufacturing a silicon wafer, is then obtained.

A method for manufacturing a silicon wafer of a second aspect of the present invention includes a step of forming an oxide film either in a first surface or in a second surface of a silicon wafer which is sliced from a silicon single-crystal ingot, and a step of annealing the silicon wafer in which the oxide film is formed.

It is preferable that in the step of annealing the silicon wafer, the annealing is performed in a non-oxidizing atmosphere at a temperature of 1150° C. or higher. A silicon wafer which is manufactured by the above-described method for manufacturing a silicon wafer, is then obtained.

A method for manufacturing a silicon wafer of a third aspect of the present invention includes a step of annealing a silicon wafer which is sliced from a silicon single-crystal ingot, at a temperature of 1150° C. or higher while changing an annealing atmosphere from a non-oxidizing atmosphere to an oxidizing atmosphere, thereby forming a DZ layer and an oxide film in a first surface and in a second surface of the silicon wafer, and a step of removing either or both of a portion of the oxide film formed in the first surface and a portion of the oxide film formed in the second surface It is preferable that the oxide film is formed to a thickness of 0.20 nm or more. A silicon wafer which is manufactured by the above-described method for manufacturing a silicon wafer, is then obtained.

Inventors discovered the followings. When a wafer is annealed, slip dislocations may occur due to thermal stress from portions in a rear surface of the wafer at which the wafer is supported. However, extent of propagation of these slip dislocations depends on a thickness of a DZ layer formed in the wafer, that is, it depends on an Oi concentration (oxygen concentration) in the rear surface (support surface during annealing) of the wafer. The reason is thought to be as follows. When the slip dislocations are formed, oxygen precipitates formed in a vicinity of the dislocations fix the slip dislocations, thereby dislocation propagation can be halted. However, in the case in which a density and a size of the precipitates are insufficient for halting the slip dislocations, the slip dislocation propagation is not suppressed. This is thought to be the reason why the extent of propagation of the slip dislocations depends on the Oi concentration. Therefore, in order to suppress the propagation of the slip dislocations which may lead to reduce a strength of the wafer, it is necessary to provide a sufficient Oi concentration in a vicinity of points in which the slip dislocations occur in the rear surface (support surface) of the wafer.

Hence, in order to maintain the strength of the wafer, the inventors make the oxygen concentration in the rear surface (support surface) of the wafer into a prescribed value, that is, adopt either a means of removing a DZ layer in the rear surface of the wafer, thereby exposing the bulk layer (BMD layer), or a means of setting the oxygen concentration in the rear surface (support surface) of the wafer so as to be an oxygen concentration at which precipitates having necessary density and size to fix the slip dislocations can be formed. In order to set the oxygen concentration as described above, the inventors adopt a means to anneal the wafer in which the rear surface has an oxide film.

Here, an ability to suppress the slip dislocations by depositing the oxide film is explained.

FIG. 7 is a typical graph showing the Oi concentration in a wafer thickness direction.

As indicated by a symbol S in FIG. 7, the Oi concentration in a sliced wafer (a wafer after mirror polishing) is substantially constant. In the case in which there is no oxide film in a wafer and the wafer is subjected to annealing for forming a DZ layer, interstitial oxygen diffuses outward (out-diffusion) from a surface of the wafer. Therefore, as shown in a symbol A in FIG. 7, the Oi concentration near the surface of the wafer declines. On the other hand, in the case in which an oxide film is formed in a wafer and the wafer is subjected to annealing, as shown in a symbol Y in FIG. 7, decline in Oi concentration near a surface of the wafer is suppressed. As a result, an oxygen concentration is obtained at which precipitates having necessary density and size to fix the slip dislocations can be formed, and so it is thought that a state adequate to suppress the slip dislocations can be maintained.

Here, FIG. 7 does not show in detail a behavior of the Oi concentration in a portion corresponding to a BMD layer. The oxygen concentrations employed in this Specification are measured according to ASTM-F121-1979.

According to the method for manufacturing a silicon wafer of the first aspect of the present invention, by removing the portion of the DZ layer in the second surface (here, the second surface is defined as a support surface by which the wafer is supported during annealing), BMD layer is exposed on the second surface. Therefore, dislocations are fixed by precipitates arising from interstitial oxygen, and dislocation propagation is suppressed. Consequently, when annealing the wafer in order to impart desired characteristics before forming devices on the first surface on which the DZ layer is exposed, even if slip dislocations occur during annealing, oxygen precipitates are formed in a vicinity of the slip dislocations, thereby dislocation propagation is halted, and a reduction in the strength of the wafer due to occurrence of the slip dislocations is suppressed. Consequently, silicon wafers can be obtained which have the DZ layer indispensable for device fabrication, and which retain high mechanical strength.

According to the methods for manufacturing a silicon wafer of the second and third aspects, by forming the oxide film in at least the second surface, the oxide film in the second surface is exposed, thereby a decline in the oxygen concentration in the wafer during annealing is suppressed by the oxide film. Consequently, an oxygen concentration can be maintained which is sufficient to suppress propagation of the slip dislocations. Therefore, when the wafer is annealed in subsequent processes, the propagation of the slip dislocations during annealing can be suppressed. Hence, reductions in the wafer strength due to the slip dislocations can be suppressed, and silicon wafers can be obtained which have the DZ layer indispensable for device fabrication, and which retain high mechanical strength.

BRIEF DESCRIPTION OF THE DRAWINGS

FIG. 3A is a diagram showing a silicon single crystal pulled by a CZ method, in an explanatory diagram illustrating an example of a method for manufacturing a silicon wafer of a first embodiment of the invention.

FIG. 3B is a diagram showing a process of slicing a portion of the silicon single crystal pulled by the CZ method into a cylindrical ingot and removing a circumferential portion, in an explanatory diagram illustrating an example of a method for manufacturing a silicon wafer of a first embodiment of the invention.

FIG. 3C is a diagram showing a process of forming wafers from the cylindrical ingot, in an explanatory diagram illustrating an example of a method for manufacturing a silicon wafer of a first embodiment of the invention.

FIG. 3D is a diagram showing a process of flattening the wafer, removing a damage layer, and mirror-polishing, in an explanatory diagram illustrating an example of a method for manufacturing a silicon wafer of a first embodiment of the invention.

FIG. 3E is a diagram showing a process of heat-treating a mirror-polished wafer, in an explanatory diagram illustrating an example of a method for manufacturing a silicon wafer of a first embodiment of the invention.

FIG. 3F is a diagram showing a process of exposing a BMD layer in a second surface of the wafer, on which devices are not formed, in an explanatory diagram illustrating an example of a method for manufacturing a silicon wafer of a first embodiment of the invention.

DESCRIPTION OF THE PREFERRED EMBODIMENTS

Below, embodiments of the invention are explained based on the drawings.

Figure 1:
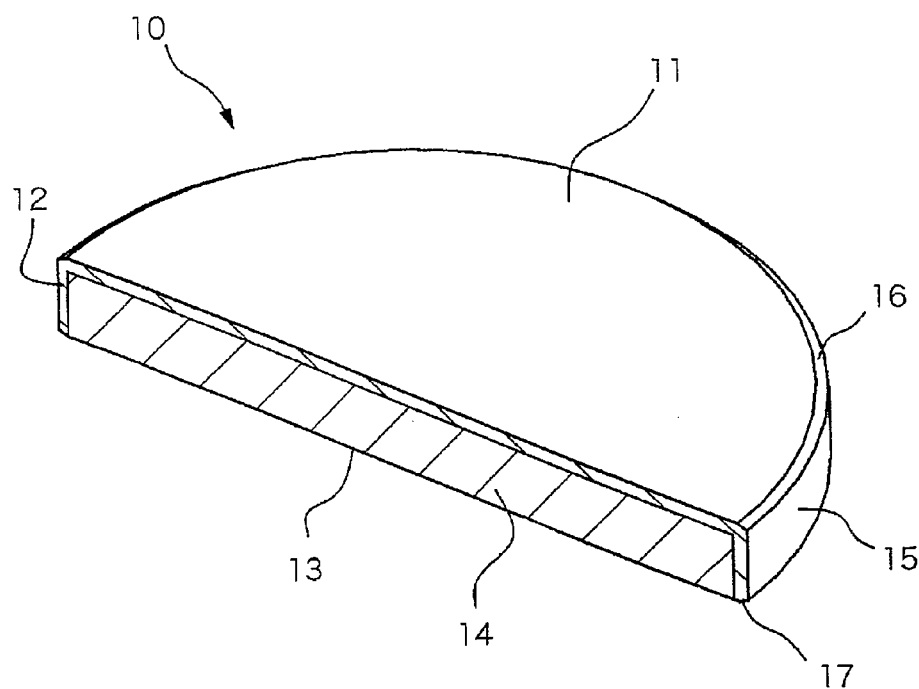
FIG. 1 is a schematic diagram showing one of examples of a silicon wafer of the present invention.

FIG. 1 is a schematic diagram showing one of examples of a silicon wafer of the present invention. Here, it should be noted that to facilitate explanation of the silicon wafer shown, a thickness has been exaggerated. On this silicon wafer 10, a DZ (denuded zone) layer 12 is exposed on a first surface (device fabrication surface) on which devices are subsequently to be fabricated, and similarly, the DZ (denuded zone) layer 12 is exposed on a circumferential surface 15 and on a beveled edges 16, 17. Further, a BMD (bulk micro defect) layer 14 is exposed on a second surface 13 which is a surface supported during annealing and is also a rear surface opposite the device fabrication surface.

The DZ layer 12 is a layer in which crystal defects do not exist, and on a surface thereof, devices are fabricated in subsequent processes. In the BMD layer 14, an oxygen concentration near the second surface 13 is for example $10 \times 10^{17}$ atoms/cm$^3$, and the BMD layer 14 acts as a gettering layer (IG layer). This silicon wafer 10 is characterized in that the BMD layer 14 is exposed on the second surface 13 which is the rear surface opposite the device fabrication surface.

In the second surface 13 which is supported by a heat treatment jig and the like during the annealing described below, it is preferable that the oxygen concentration is $8 \times 10^{17}$ atoms/cm$^3$ or higher, and more preferable that the concentration is $10 \times 10^{17}$ atoms/cm$^3$. In the case in which the above oxygen concentration is lower than $8 \times 10^{17}$ atoms/cm$^3$, precipitates cannot be formed sufficiently, slip dislocations propagate, and the wafer strength is reduced, which is undesirable. And in the case in which the oxygen concentration is lower than $10 \times 10^{17}$ atoms/cm$^3$, precipitates to suppress slip dislocation propagation are at least formed, however in in-plane directions of the wafer, there is a possibility that a density distribution of oxygen occurs to cause insufficient precipitate formation in some areas, which is undesirable.

In this silicon wafer 10, because the BMD layer 14 is exposed on the second surface 13, even in the case in which dislocation defects (slip) occur in the second surface 13 during heat treatment in subsequent processes, propagation can be suppressed. This is due to the fact that a movement of the dislocations in silicon depends greatly on an interstitial oxygen concentration. In a silicon wafer having a high oxygen concentration, a formation of minute precipitates on a dislocation line fixes the dislocation, so that considerable thermal stress is necessary for dislocation motion. However, in the case in which a dislocation occurs in a DZ layer having a low oxygen concentration, it is not expected to obtain an effect to fix the dislocations by the interstitial oxygen. A dislocation which begins to move in the DZ layer is not stopped even in a BMD layer (bulk region) which has an oxygen concentration higher than that in the DZ layer, so that the slip dislocation propagates. Therefore, the BMD layer 14 is needed to be adequately exposed on the second surface 13.

During annealing, by exposing the BMD layer 14 in the second surface 13 in which the slip dislocations easily occur, the dislocation propagation is suppressed by the precipitates formed from the interstitial oxygen present in the vicinity of the second surface 13. Therefore, a reduction in strength of the silicon wafer 10 is suppressed even after a heat treatment in subsequent processes. The silicon wafer 10 can be obtained which includes a DZ layer 12 and maintains high mechanical strength. And even when the silicon wafer 10 thus manufactured is subjected to a heat treatment during a device fabrication process, reductions in strength are similarly suppressed. Therefore, excellent strength characteristics are obtained even while the wafer has the DZ layer 12.

Figure 2:
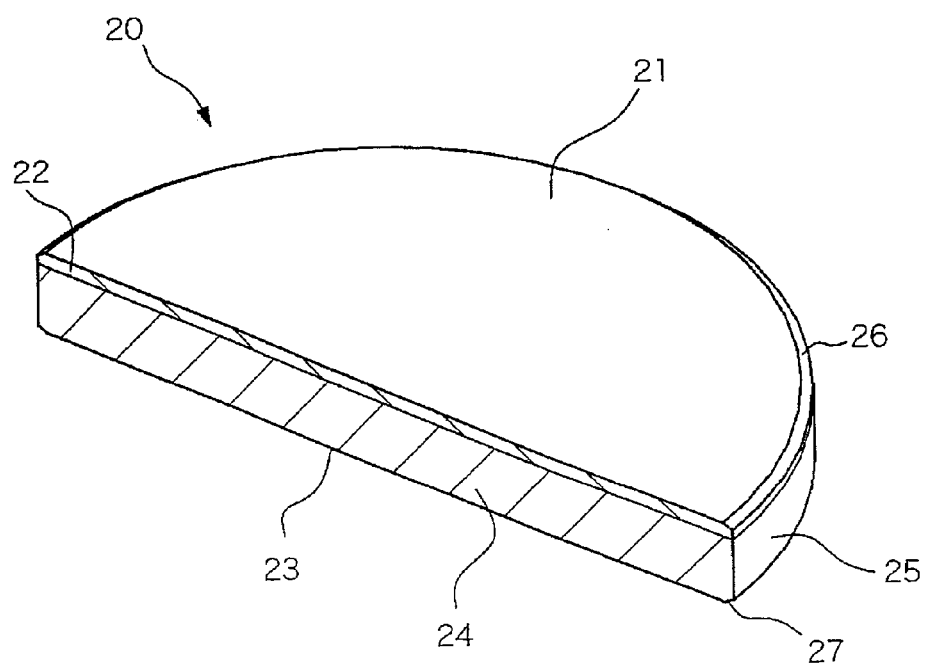
FIG. 2 is a schematic diagram showing another example of a silicon wafer of the present invention.

Here as shown in FIG. 2, a structure may also be adopted in which a BMD layer 24 is exposed on a circumferential surface 25 of a silicon wafer 20.

This silicon wafer 20 has a DZ layer 22 exposed on a first surface 21 (device fabrication surface) on which devices are to be fabricated in subsequent processes, and the DZ (denuded zone) layer 22 is also exposed on a first beveled surface 26. In addition, a BMD layer 24 is exposed on a second surface 23 which is a rear surface opposite the device fabrication surface, and the BMD layer 24 is also exposed on the circumferential surface 25 and a second beveled surface 27. Here, the DZ layer 22 is exposed on a first-surface side 21 of the circumferential surface 25 of the silicon wafer 20.

By causing the BMD layer 24 to be exposed on the second surface 23 in the silicon wafer 20, dislocation propagation is suppressed by precipitates. Furthermore, because the BMD layer 24 is exposed on the circumferential surface 25 of the silicon wafer 20, dislocation propagation in the circumferential surface 25 and the beveled surface 27 of the silicon wafer 20 is also suppressed. By this means, in the silicon wafer 20, a necessary and sufficient strength can be maintained in the circumferential surface 25 and the beveled surface 27 which tend to receive shocks in subsequent processes. Therefore, a risk of damage is reduced and still greater strength of the silicon wafer 20 can be maintained.

Next, a method for manufacturing a silicon wafer of the first embodiment of the invention, applied to manufacture a silicon wafer having the above-described configuration, is explained.

FIG. 3A through FIG. 3F are explanatory diagrams illustrating the method for manufacturing a silicon wafer of the first embodiment of the invention. A silicon single crystal C is pulled by the CZ method, and a portion of the silicon single crystal C is cut into a cylindrical ingot N, and a circumferential portion is removed (FIG. 3B). This cylindrical ingot N is sliced at a prescribed thickness to obtain numerous wafers (silicon wafers) 30a (FIG. 3C). A first surface 31 and a second surface 33 of the wafer 30a are subjected to lapping, beveling, etching, and other processes to flatten the wafer surfaces and remove damage layers, followed by mirror polishing (FIG. 3D). Here, in FIG. 3A through FIG. 3F, wafers in a beveled state are omitted.

A mirror-polished wafer 30a is then subjected to annealing to control oxygen precipitation. In this process, annealing is performed in a non-oxidizing atmosphere at a temperature of 1000° C. or higher. In the wafer 30a which has been subjected to this heat treatment, a BMD layer 34 is formed which makes up an intrinsic gettering (IG) region in a center portion, as shown in FIG. 3E, and also, a DZ (denuded zone) layer 32 is formed in the first surface 31, second surface 33, and a circumferential surface 35.

Next, as shown in FIG. 3F, in the wafer 30a, the second surface 33 on which no devices are to be formed is subjected to mirror polishing so as to remove a portion of the DZ layer 32 in the second surface 33, and the BMD layer 34 is exposed on the second surface 33. Removal of the portion of the DZ layer 32 may be performed by polishing to reduce a thickness of the portion of the DZ layer 32 until the oxygen concentration in the surface of the second surface 33 is at least $8 \times 10^{17}$ atoms/cm$^3$ or higher, and preferably $10 \times 10^{17}$ atoms/cm$^3$ or higher. By means of this DZ layer removal process, a silicon wafer 30 is formed in which the DZ layer 32 is exposed on the first surface 31, and the BMD layer 34 is exposed on the second surface 33.

In this silicon wafer 30, when annealing is performed to impart desired characteristics prior to a formation of devices on the first surface 31 on which the DZ layer 32 is exposed, the BMD layer 34 is exposed on the second surface 33. As a result, dislocation propagation is suppressed by precipitates in the BMD layer 34, thereby a reduction in wafer strength due to slip dislocations is suppressed. In this way, the silicon wafer 30 is obtained which includes the DZ layer 32 indispensable for device formation and has high mechanical strength.

While omitted from the above explanation, by further performing a beveling process, silicon wafers are manufactured with a structure similar to that of the silicon wafer 10 and having the beveled edges 16, 17 as shown in FIG. 1.

It is preferable that, when the portion of the DZ layer 32 in the second surface 33 is removed by the mirror polishing as shown in FIG. 3F, a portion of the DZ layer 32 in a circumferential surface 35 of the wafer 30a is also removed to expose the BMD layer 34 on the circumferential surface 35 as well. Thereby dislocation propagation from the circumferential surface 35 of the silicon wafer 30 is suppressed, and the strength of the silicon wafer 30 can be made still higher.

While omitted from the above explanation, by further performing a beveling process, silicon wafers are manufactured with a structure similar to that of silicon wafers 20 and having the beveled edges 26, 27 as shown in FIG. 2.

In order to remove the portion of the DZ layer 32, as long as the surface is made in a mirror-polished state in the end, it is also possible to employ other means in addition to mirror polishing, or other means instead of mirror polishing. For example, a method in which a process of laser etching, surface polishing, or wet etching is performed in advance, followed by mirror polishing can be employed.

Next, a method for manufacturing a wafer of a second embodiment of the invention is explained, based on the drawings.

FIG. 4A through FIG. 4D are explanatory diagrams illustrating one example of the method for manufacturing a silicon wafer of the second embodiment of the invention.

In the method for manufacturing a silicon wafer 50 of this embodiment, before a step corresponding to the step of forming the DZ layer 32 in the first embodiment as shown in FIG. 3D and FIG. 3E, a step of forming an oxide film 58 in a second surface 53 which is a rear surface opposite a device fabrication surface is employed. This is a difference between the first embodiment and the second embodiment.

Figure 4A:
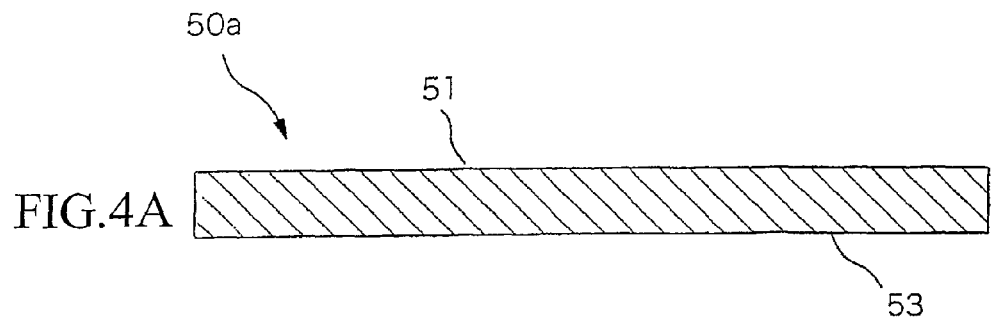
FIG. 4A is a diagram showing a process of subjecting a first surface and a second surface of a wafer to a surface treatment such as a mirror polishing, in an explanatory diagram illustrating one example of a method for manufacturing a silicon wafer of a second embodiment of the invention.

Similarly to the first embodiment as shown in FIG. 3, a silicon single-crystal ingot pulled using the CZ method is sliced at a prescribed thickness to obtain wafers (silicon wafers) 50a, a first surface 51 and a second surface 53 of the wafer 50a are subjected to surface treatment such as mirror polishing (FIG. 4A).

Figure 4B:
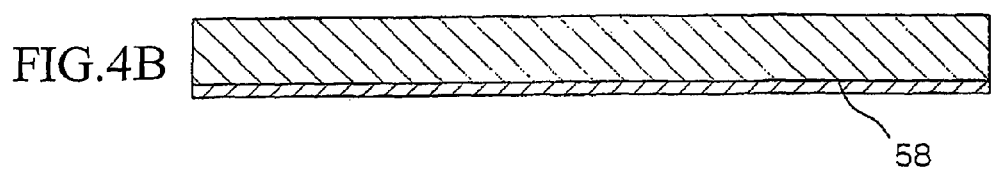
FIG. 4B is a diagram showing a process of forming an oxide film in the second surface, in an explanatory diagram illustrating one example of a method for manufacturing a silicon wafer of a second embodiment of the invention.
Figure 4C:
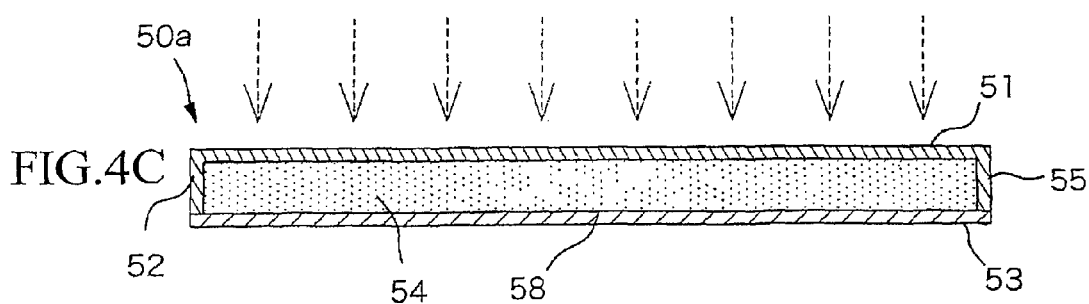
FIG. 4C is a diagram showing a process of heat treatment, in an explanatory diagram illustrating one example of a method for manufacturing a silicon wafer of a second embodiment of the invention.

Next, as shown in FIG. 4B, prior to performing heat treatment, the oxide film 58 is formed in the second surface 53. It is preferable that this oxide film 58 is formed at a thickness of for example 20 nm or greater. The oxide film 58 may be formed by heating the wafer 50a in an oxidizing atmosphere to form the oxide film over the entirety of the wafer 50a, followed by selectively removing only a portion of the oxide film in the first surface 51 using hydrofluoric acid and the like. Alternatively, the oxide film 58 may be formed by using other means such as selectively forming the oxide film 58 only in the second surface 53.

The wafer 50a in which the oxide film 58 is formed only in the second surface 53 is subjected to annealing to occur IG (intrinsic gettering). This IG may be induced by for example annealing in a non-oxidizing atmosphere at a temperature of 1150° C. or higher. By the annealing process, as shown in FIG. 4D, a DZ layer 52 is formed in the first surface 51 and a circumferential surface 55, and also a BMD (bulk micro defect) layer 54 which acts as a gettering layer in the IG spreads in the wafer, resulting in a wafer 50a having an oxide film 58 formed in the second surface 53.

Next, the oxide film 58 in the second surface 53 is mirror-polished and removed. Here, the oxide film 58 can be selectively removed using hydrofluoric acid or the like.

By this means, a silicon wafer with configuration similar to that of the one example shown in FIG. 1 is manufactured.

Figure 4D:
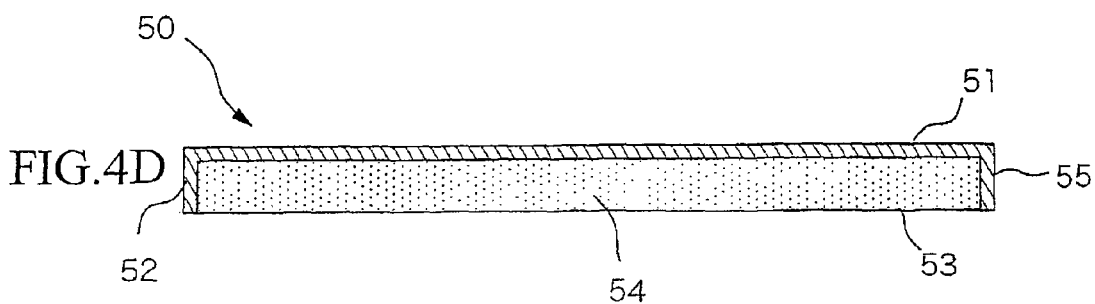
FIG. 4D is a diagram showing a process of removing the oxide film in the second surface by the mirror polishing, in an explanatory diagram illustrating one example of a method for manufacturing a silicon wafer of a second embodiment of the invention.

As shown in FIG. 4D, a DZ (denuded zone) layer 52 is exposed on the first surface 51 of this silicon wafer 50 on which devices are to be fabricated in subsequent processes. And, a BMD (bulk micro defect) layer 54 which acts as a gettering layer in the IG, is exposed on the second surface 53 which is supported by a support jig and the like during heat treatment.

According to this method for manufacturing a silicon wafer 50, because the oxide film 58 is formed in the second surface 53, the second surface 53 can be covered by the oxide film 58 which has an extremely high oxygen concentration in heat treatment to form the DZ layer 52 or other heat treatments. By this means, during heat treatment to form the DZ layer 52, a sufficient Oi concentration is maintained in the second surface 53 and precipitates having sufficient density and size to suppress dislocation propagation can be obtained in a vicinity of slip dislocations.

As a result, in heat treatment to form a DZ layer 52 or other heat treatments among the processes to manufacture the silicon wafer 50, even when dislocation defects (slip) occur in the second surface 53, oxygen precipitates are formed in a vicinity of dislocation lines, thereby propagation is suppressed. That is, by forming the oxide film 58, dislocation propagation is suppressed. Because dislocation propagation in the silicon wafer 50 is suppressed in this way, reductions in the strength of the silicon wafer 50 due to heat treatment in subsequent processes are suppressed. Thus, the silicon wafer 50 having the DZ layer 52 with high mechanical strength can be obtained.

Furthermore, the BMD layer 54 is exposed on the second surface 53 of the silicon wafer 50 which is manufactured in this way. Therefore, similarly to the first embodiment, even when heat treatment is performed to fabricate devices and the like on the silicon wafer 50, reduction in strength of wafer is suppressed. Consequently, excellent strength characteristics are obtained even while having a DZ layer 52.

Figure 5:
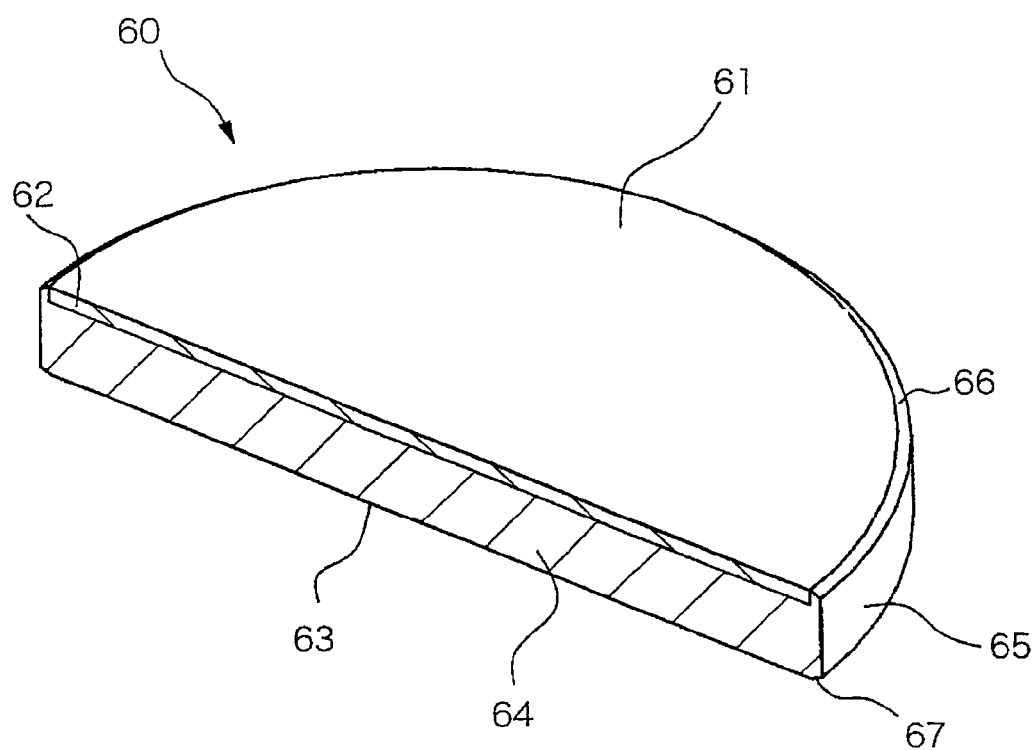
FIG. 5 is a schematic diagram showing the other example of a silicon wafer of the present invention.

FIG. 5 is a schematic diagram showing the other example of a silicon wafer of the present invention.

As shown in FIG. 5, in this silicon wafer 60 a DZ layer 62 is exposed on a first surface 61, and a BMD layer 64 is exposed on a second surface 63, a circumferential surface 65, and beveled surfaces 66, 67. By thus exposing the BMD layer 64 on the circumferential surface 65 and on the beveled surfaces 66, 67, dislocation propagation from the circumferential surface 65 and from the beveled surfaces 66, 67 of the silicon wafer 60 is suppressed, and the strength of the silicon wafer 60 can be further improved, which is preferable.

In order to manufacture the above-described silicon wafer, the method for manufacturing a silicon wafer of the second embodiment of the invention is explained. FIG. 6A through FIG. 6D are explanatory diagrams illustrating the other example of the method for manufacturing a silicon wafer of the second embodiment of the invention.

Figure 6:
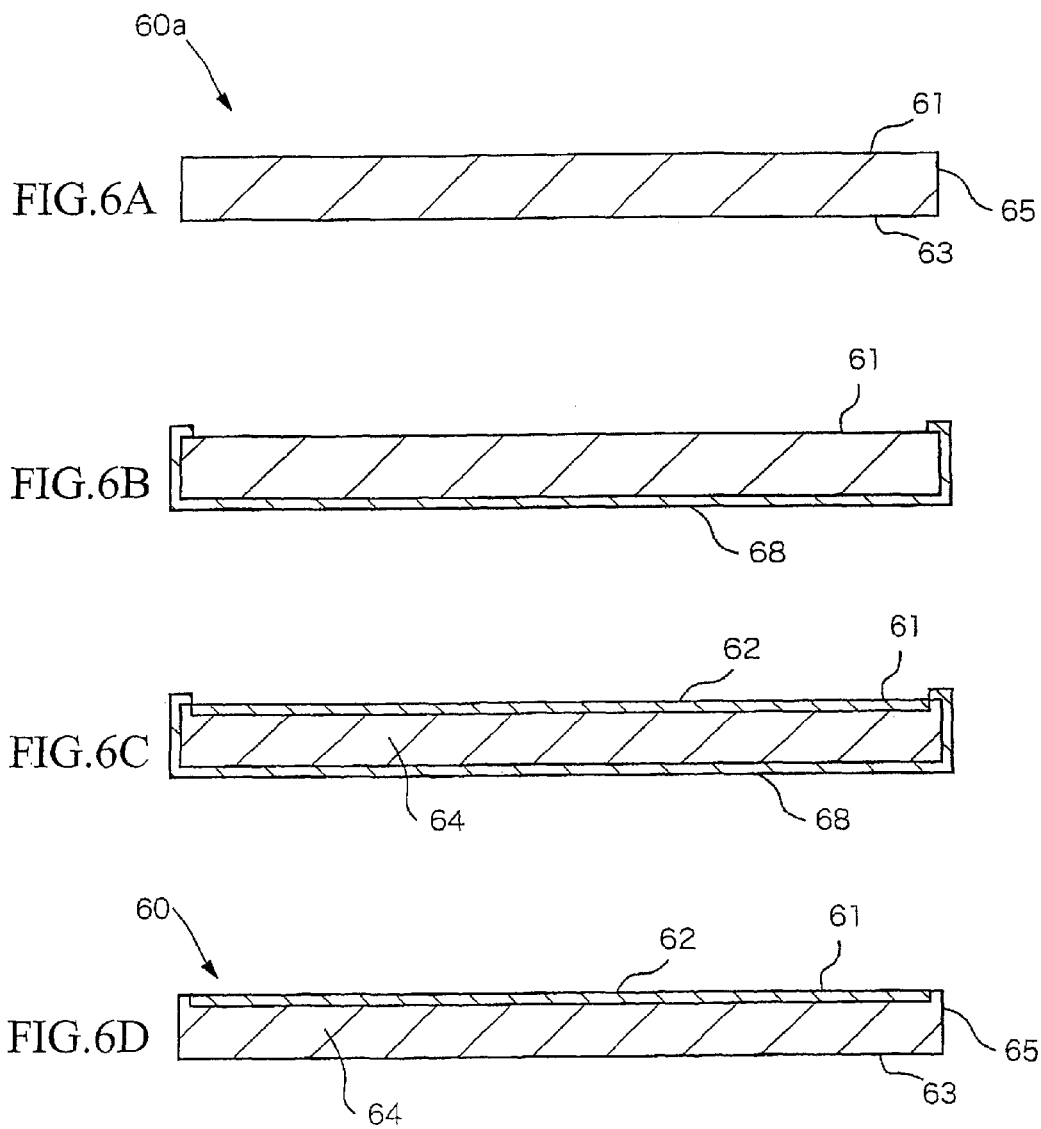
FIG. 6A is a diagram showing a process of subjecting a first surface and a second surface of a wafer to a surface treatment such as a mirror polishing, in an explanatory diagram illustrating the other example of a method for manufacturing a silicon wafer of a second embodiment of the invention.
FIG. 6B is a diagram showing a process of forming an oxide film, in an explanatory diagram illustrating the other example of a method for manufacturing a silicon wafer of a second embodiment of the invention.
FIG. 6C is a diagram showing a process of heat treatment, in an explanatory diagram illustrating the other example of a method for manufacturing a silicon wafer of a second embodiment of the invention.
FIG. 6D is a diagram showing a process of removing a portion of the oxide film in the second surface by the mirror polishing, in an explanatory diagram illustrating the other example of a method for manufacturing a silicon wafer of a second embodiment of the invention.
Figure 7:
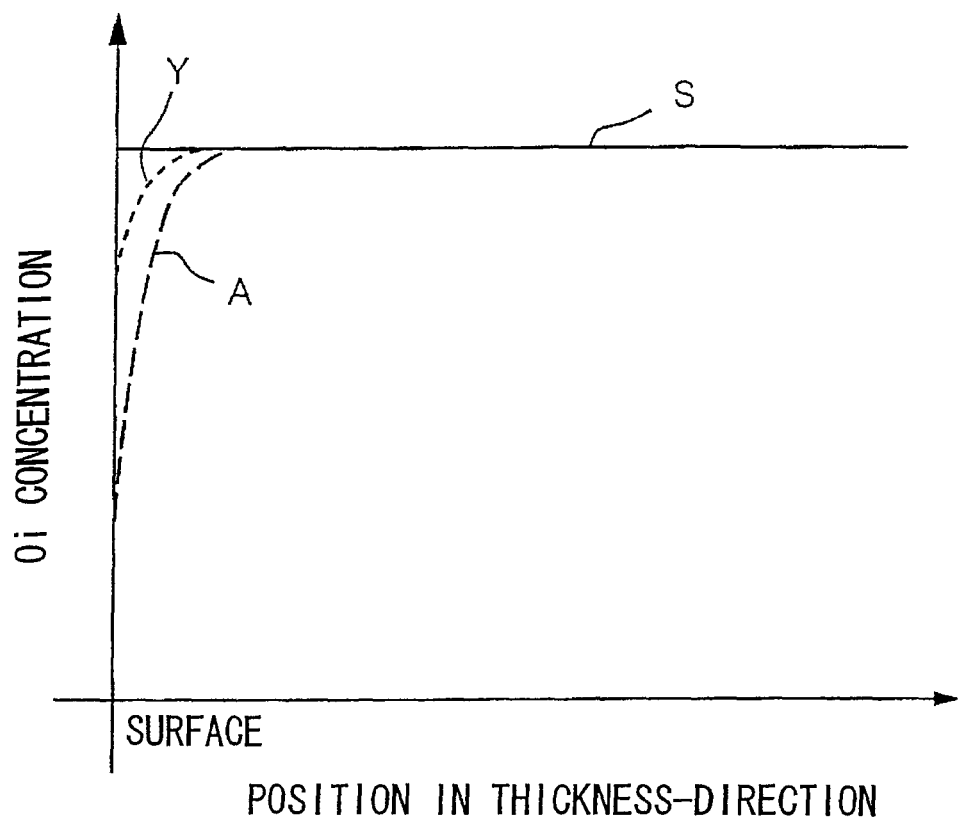
FIG. 7 is a graph showing an Oi concentration in a wafer depth direction, to explain an action of an oxide film in a silicon wafer of the present invention.

Similarly to the first embodiment as shown in FIG. 3, a silicon single-crystal ingot pulled using the CZ method is sliced at a prescribed thickness to obtain wafers (silicon wafers) 60a. A first surface 61, a second surface 64, a circumferential surface 65, and surfaces corresponding to beveled surfaces 66, 67 as shown in FIG. 5 are subjected to mirror polishing and other surface treatment (FIG. 6A). Here, in FIG. 6A through FIG. 6D, beveled surfaces are not shown.

As shown in FIG. 6B, an oxide film 68 is then formed in the second surface 63, the circumferential surface 65, and the surfaces corresponding to the beveled surfaces 66, 67 of the mirror-polished wafer 60a. It is preferable that this oxide film 68 is formed at a thickness of for example 20 nm or more. The oxide film 68 may be formed by heating the wafer 60a in an oxidizing atmosphere to form the oxide film over the entirety of the wafer 60a, followed by selectively removing only a portion of the oxide film in the first surface 61 using hydrofluoric acid and the like. Alternatively, the oxide film 58 may be formed by using other means such as selectively forming the oxide film 68 only in the second surface 63, the circumferential surface 65, and the surfaces corresponding to the beveled surfaces 66, 67.

The wafer 60a in which the oxide film 68 is formed only in the second surface 63, the circumferential surface 65, and the surfaces corresponding to the beveled surfaces 66, 67 is subjected to annealing. By the annealing process, in a surface portion in which the oxide film 68 is located and a deep portion in the wafer, precipitation nuclei which can become IG (intrinsic gettering) sites are precipitated, and in a surface portion in which the oxide film 68 is not located, interstitial oxygen diffuses outward to form a DZ layer 62. This annealing should be performed for example in a non-oxidizing atmosphere at a temperature of 1150° C. or higher. In the second surface 63, the circumferential surface 65, and the surfaces corresponding to the beveled surfaces 66, 67, because the oxide film 68 is present, oxygen diffuses inward (in-diffusion) from the oxide film 68 which is a sort of a oxygen supply source. Therefore, the decline in oxygen concentration is more gradual than that in a portion in which the DZ layer 62 is formed.

As a result, as shown in FIG. 6C, by this annealing process, the wafer 60a is fabricated which has the DZ layer 62 formed in the first surface 61 and a BMD (bulk micro defect) layer 64 formed in an interior, the second surface 63, the circumferential surface 65, and the surfaces corresponding to the beveled surfaces 66, 67.

Next, the oxide film 68 is removed. Thereby a silicon wafer 60 is manufactured in which the DZ layer 62 is exposed only on the first surface 61.

The wafer is subjected to the above-described heat treatment to form the DZ layer in a state in which the oxide film 68 is formed in the second surface 63, the circumferential surface 65, and the beveled surfaces 66, 67. Therefore, in the heat treatment to form the DZ layer 62, a sufficient oxygen concentration is maintained in the second surface 63, the circumferential surface 65, and the beveled surfaces 66, 67, thereby precipitates can be obtained with sufficient density and size to suppress dislocation propagation. As a result, because dislocation propagation in the second surface 63, circumferential surface 65, and beveled surfaces 66, 67 can be suppressed by these precipitates, reduction of the wafer strength due to slip dislocations is suppressed. Thus, the silicon wafer 60 having the DZ layer 62 indispensable for device fabrication with high strength can be obtained.

Here, when performing annealing for forming the oxide film, the oxide film may be formed in the first surface and the second surface of the silicon wafer by annealing for example at a temperature of 1150° C. or higher in an atmosphere which is changed from non-oxidizing to oxidizing. Thereafter, only a portion of the oxide film in the first surface, on which devices are to be fabricated, is removed.

Depending on product specifications, it may be possible to omit removal of the oxide film formed during annealing. That is, a silicon wafer can be fabricated having an oxide film in portions other than a DZ layer, in a second surface alone, or in portions excluding at least the DZ layer which is to be a device area.

According to this silicon wafer, because the oxide film is present in the second surface, even in the case in which the silicon wafer is subjected to heat treatment to fabricate devices, a sufficient Oi concentration can be maintained in the second surface. Hence, precipitates having adequate density and size to suppress dislocation propagation can be obtained in a vicinity of slip dislocations. As a result, even when dislocation defects (slip) occur in the second surface, oxygen precipitates are formed in a vicinity of a dislocation line, and propagation is suppressed. Thus, excellent strength characteristics are obtained while having the DZ layer 62.

EXAMPLES

Example 1

The inventors verified an influence of the DZ layer on a wafer strength (or slip dislocation). In order to perform the verification, the following wafers were prepared: a mirror-polished wafer prior to annealing (Sample 1); a wafer annealed at 1200° C. for one hour in Ar (Sample 2); a wafer which is annealed in Ar, followed by polishing to remove a portion of 10 μm thick from a rear surface (second surface) (Sample 3); and a wafer which is annealed in Ar, followed by polishing to remove a portion of 30 μm thick from a rear surface (Sample 4).

Resistivity of all the wafers was in a range from 3 to 11 Ω·cm. These wafers were subjected to heat treatment for thermal stress loading using a vertical furnace under a condition in which the wafers were set into the furnace at 900° C., temperature was ramped up at 10° C./min to 1150° C., held at 1150° C. for 30 min, and ramped down at 3° C./min to 900° C., and the wafers were removed at 900° C. A surface in contact with a heat treatment boat was a rear surface (second surface) of the wafer. The rear surface of the wafer after heat treatment was observed by an X-ray topography. From the observation, it was revealed that slip dislocations had propagated from traces of the wafer boat. States of propagation of slip dislocation for the different samples are shown in Table 1. Table 1 also shows bulk oxygen concentrations of the samples prior to thermal stress load testing, and results of SIM measurements for the oxygen concentrations in a vicinity of the rear surface of the wafers. Here, "vicinity of the surface" means a portion ranging from the surface to approximately 0.5 μm thick at which an effect of contamination is small; however, thickest limit of the portion is not exactly 0.5 μm thick, so long as the effect of contamination is small.

TABLE 1

| Sample No. | DZ layer | Bulk oxygen concentration ($\times 10^{17}$ atoms/cc) | Oxygen concentration in rear surface measured by SIMS ($\times 10^{17}$ atoms/cc) | Extent of slip dislocation |
|---|---|---|---|---|
| Sample 1 | none | 12.6 | 12.4 | A |
| Sample 2 | present | 11.2 | 0.7 | C |
| Sample 3 | present (10 μm polished) | 11.1 | 7.8 | B |
| Sample 4 | present (30 μm polished) | 11.0 | 10.7 | A |

(A: Almost no slip occurrence, B: some slip occurrence, C: extensive slip dislocation occurrence)

From the verification results shown in Table 1, the higher the oxygen concentration in the rear surface (second surface), the less the occurrence of slip dislocations. It is confirmed that by exposing a BMD layer or an oxide film which has high oxygen concentration on the second surface of the silicon wafer, slip dislocations are reduced and the strength of the silicon wafer is greatly enhanced.

Example 2

Next, the inventors verified a suppression of slip dislocations due to a formation of an oxide film. Outward diffusion of oxygen in an annealing process can also be prevented by forming the oxide film to protect the rear surface of the wafer prior to annealing. This is because the oxygen concentration at a surface interface between the oxide film and the silicon is constantly maintained at a thermal equilibrium concentration. At a temperature of 1150° C. or higher, the thermal equilibrium concentration of interstitial oxygen is approximately $8 \times 10^{17}$ atoms/cc, and an effect to prevent propagation of slip dislocation can be expected. It is desirable that the oxide film formed before annealing has a thickness of 20 nm or thicker. The reason is as follows. In the case in which the thickness of the oxide film is thinner, the oxide film easily dissociates from the surface in heat treatment in a non-oxidizing atmosphere such as Ar or $H_2$, however in the case in which the thickness is 20 nm or more, the oxide film can be sufficiently stable against the annealing process.

A formation of the oxide film is effectively conducted during the annealing process. By changing the gas atmosphere from a non-oxidizing atmosphere to an atmosphere containing some oxygen gas in the annealing process, the wafer surface is oxidized. Interstitial oxygen is in-diffused from a thermal oxide film formed at this time, thereby a concentration of interstitial oxygen in the wafer surface can be raised.

In order to investigate an effect of the oxide film on the strength (or slip dislocations) of an annealed wafer, wafers were prepared as follows. An oxide film having a thickness of approximately 20 nm was grown at 1000° C. on mirror-polished wafers prior to annealing, and a portion of the oxide film only in a front surface was then removed using a diluted HF solution. The wafers were annealed in Ar at 1200° C. for one hour (Sample 5) or at 1150° C. for two hours (Sample 6). Also, wafers (Sample 7 and Sample 8) were prepared by annealing in Ar at 1200° C. for one hour, followed by changing temperature in a furnace to 1150° C. and holding the temperature to anneal in 95% Ar+5% $O_2$ for three hours and for five hours respectively. A thickness of the oxide film formed in the rear surface by the annealing was measured, and the oxide film was then removed using a diluted HF solution to perform the following tests.

Resistivity of all the wafers was in a range from 3 to 11 Ω·cm. These wafers were subjected to heat treatment for thermal stress loading using a vertical furnace under a condition in which the wafers were, set into the furnace at 900° C., temperature was ramped up at 10° C./min to 1150° C., held at 1150° C. for 30 min, and ramped down at 3° C./min to 900° C., and the wafers were removed at 900° C. A surface in contact with the heat treatment boat was a rear surface (second surface) of the wafer. The rear surface of the wafer after heat treatment was observed by an X-ray topography. From the observation, it was revealed that slip dislocations had propagated from traces of the wafer boat. States of propagation of slip dislocation for the different samples are shown in Table 2. Table 2 also shows bulk oxygen concentrations of the samples prior to thermal stress load testing, and results of SIM measurements for the oxygen concentrations in a vicinity of the rear surface of the wafers.

TABLE 2

| Sample No. | Oxide film growth | Anneal process | Oxide film thickness (nm) | Oxygen concentration in rear surface measured by SIMS ($\times 10^{17}$ atoms/cc) | Extent of slip dislocation |
|---|---|---|---|---|---|
| Sample 5 | growth before anneal process | 1200° C./ 1 hr | 21.0 | 10.3 | A |
| Sample 6 | growth before anneal process | 1150° C./ 2 hrs | 23.5 | 8.7 | B |
| Sample 7 | growth during anneal process | 1200° C./ 1 hr + 1150° C./ 3 hrs | 22.4 | 8.1 | B |
| Sample 8 | growth during anneal process | 1200° C./ 1 hr + 1150° C./ 5 hrs | 35.8 | 8.4 | B |

(A: Almost no slip occurrence, B: some slip occurrence, C: extensive slip dislocation occurrence)

According to the verification results shown in Table 2, occurrence of slip dislocations was greatly suppressed in all samples 5 to 8 compared with Sample 1. High-temperature annealing is generally performed for the purpose of reducing the COP and micro oxygen precipitates in a vicinity, of a surface. When micro defects in the vicinity of the surface was observed using a MO601 (Mitsui Mining and Smelting Co., Ltd.), numbers of defects in Samples 5 through 8 were equal to that in Sample 1, and excellent crystallinity was confirmed.

In the above, preferred embodiments of the present invention have been explained, however the present invention is not limited to these embodiments. Various additions, omissions, substitutions, and other modifications to the configuration can be made within the scope of the present invention. This invention is not limited to the foregoing explanations, but is limited solely by the scope of the attached claims.

What is claimed is:

1. A method for manufacturing a silicon wafer, comprising:
    annealing a silicon wafer which is sliced from a silicon single-crystal ingot at a temperature of 1150° C. or higher while changing an annealing atmosphere from a non-oxidizing atmosphere for one hour or more to an oxidizing atmosphere for three to five hours, thereby forming a DZ layer and forming an oxide film in a first surface, which is a device fabrication surface of the silicon wafer, and forming an oxide film in a second surface, which is a rear surface opposite a device fabrication surface of the silicon wafer; and
    removing the oxide film formed in the first surface which is the device fabrication surface.

2. The method for manufacturing a silicon wafer according to claim 1, wherein the oxide film is formed to a thickness of 20 nm or more.

3. The method for manufacturing a silicon wafer according to claim 1, where only the oxide film in the first surface is selectively removed using hydrofluoric acid.

4. The method for manufacturing a silicon wafer according to claim 1, wherein COPs in the DZ layer are reduced by annealing.

5. A method for manufacturing a silicon wafer according to claim 1, wherein an interstitial oxygen is in-diffused from a thermal oxide film while forming the oxide film in the annealing.

* * * * *